(12) United States Patent
Kurihara et al.

(10) Patent No.: US 10,497,732 B2
(45) Date of Patent: Dec. 3, 2019

(54) PHOTOELECTRIC CONVERSION APPARATUS AND CAMERA

(71) Applicant: CANON KABUSHIKI KAISHA, Tokyo (JP)

(72) Inventors: Masaki Kurihara, Koza-gun (JP); Nobuhiko Sato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/665,561

(22) Filed: Aug. 1, 2017

(65) Prior Publication Data

US 2018/0061879 A1 Mar. 1, 2018

(30) Foreign Application Priority Data

Aug. 25, 2016 (JP) ................ 2016-165072

(51) Int. Cl.
*H01L 27/146* (2006.01)
*H04N 9/04* (2006.01)

(52) U.S. Cl.
CPC .. *H01L 27/14627* (2013.01); *H01L 27/14621* (2013.01); *H01L 27/14625* (2013.01); *H01L 27/14632* (2013.01); *H04N 9/045* (2013.01)

(58) Field of Classification Search
USPC ........................................ 257/414
See application file for complete search history.

(56) References Cited

U.S. PATENT DOCUMENTS

| | | | |
|---|---|---|---|
| 6,052,509 A * | 4/2000 | Abe ................ | H04N 5/232 |
| | | | 348/E5.042 |
| 7,646,539 B2 | 1/2010 | Itoi et al. | |
| 7,777,260 B2 | 8/2010 | Katsuno et al. | |
| 7,838,918 B2 | 11/2010 | Naruse et al. | |
| 7,884,437 B2 | 2/2011 | Minamio et al. | |
| 7,932,948 B2 | 4/2011 | Higuchi et al. | |
| 8,223,250 B2 | 7/2012 | Higuchi et al. | |
| 8,786,739 B2 | 7/2014 | Kurihara | |

(Continued)

FOREIGN PATENT DOCUMENTS

| | | |
|---|---|---|
| JP | 2009-016405 A | 1/2009 |
| JP | 2009-016574 A | 1/2009 |

(Continued)

OTHER PUBLICATIONS http://www.thesaurus.com/browse/to?s=t; 2018.*

*Primary Examiner* — Nilufa Rahim

(74) *Attorney, Agent, or Firm* — Venable LLP

(57) ABSTRACT

A photoelectric conversion apparatus includes a photoelectric conversion substrate having photoelectric conversion units and a microlens array arranged above the conversion units, a light transmissive plate, a first member arranged between the photoelectric conversion substrate and the light transmissive plate, and that bonds the photoelectric conversion substrate and the light transmissive plate, and a second member arranged between the first member and the microlens array. The second member has at least one of a refractive index lower than the microlens array or a porosity higher than the microlens array. A surface on a side of the photoelectric conversion substrate of the first member has a plurality of steps from a portion over the plurality of photoelectric conversion units to a side surface of the photoelectric conversion apparatus.

20 Claims, 9 Drawing Sheets

(56) References Cited

U.S. PATENT DOCUMENTS

| | | | |
|---|---|---|---|
| 9,305,965 B2 | 4/2016 | Kurihara et al. | |
| 2005/0275741 A1* | 12/2005 | Watanabe | H01L 27/14618 348/340 |
| 2007/0126914 A1 | 6/2007 | Komatsu et al. | |
| 2007/0164193 A1* | 7/2007 | Lee | H01L 27/1462 250/200 |
| 2009/0059055 A1 | 3/2009 | Nakano et al. | |
| 2010/0270637 A1 | 10/2010 | Katsuno et al. | |
| 2010/0289939 A1* | 11/2010 | Ogino | G02B 1/11 348/340 |
| 2015/0130005 A1* | 5/2015 | Ko | H01L 27/14627 257/432 |
| 2015/0287756 A1* | 10/2015 | Ezoe | C09D 201/00 257/432 |
| 2015/0340397 A1* | 11/2015 | Seo | H01L 27/14623 257/432 |
| 2016/0043122 A1* | 2/2016 | Fujimori | H01L 27/14618 257/433 |
| 2016/0172401 A1 | 6/2016 | Kawasaki et al. | |
| 2016/0284753 A1 | 9/2016 | Komai et al. | |
| 2017/0117320 A1 | 4/2017 | Matsugai | |
| 2017/0236860 A1* | 8/2017 | Yamamoto | H01L 27/14618 257/432 |

FOREIGN PATENT DOCUMENTS

| | | |
|---|---|---|
| JP | 2009-064839 A | 3/2009 |
| JP | 2009-260269 A | 11/2009 |
| JP | 2010-034313 A | 2/2010 |
| JP | 4528879 B2 | 8/2010 |
| JP | 4794283 B2 | 10/2011 |
| JP | 5185019 B2 | 4/2013 |
| JP | 2015-135938 A | 7/2015 |
| JP | 2015-159275 A | 9/2015 |
| JP | 2016-001681 A | 1/2016 |
| JP | 2016-115706 A | 6/2016 |
| WO | 2015/111419 A2 | 7/2015 |

* cited by examiner

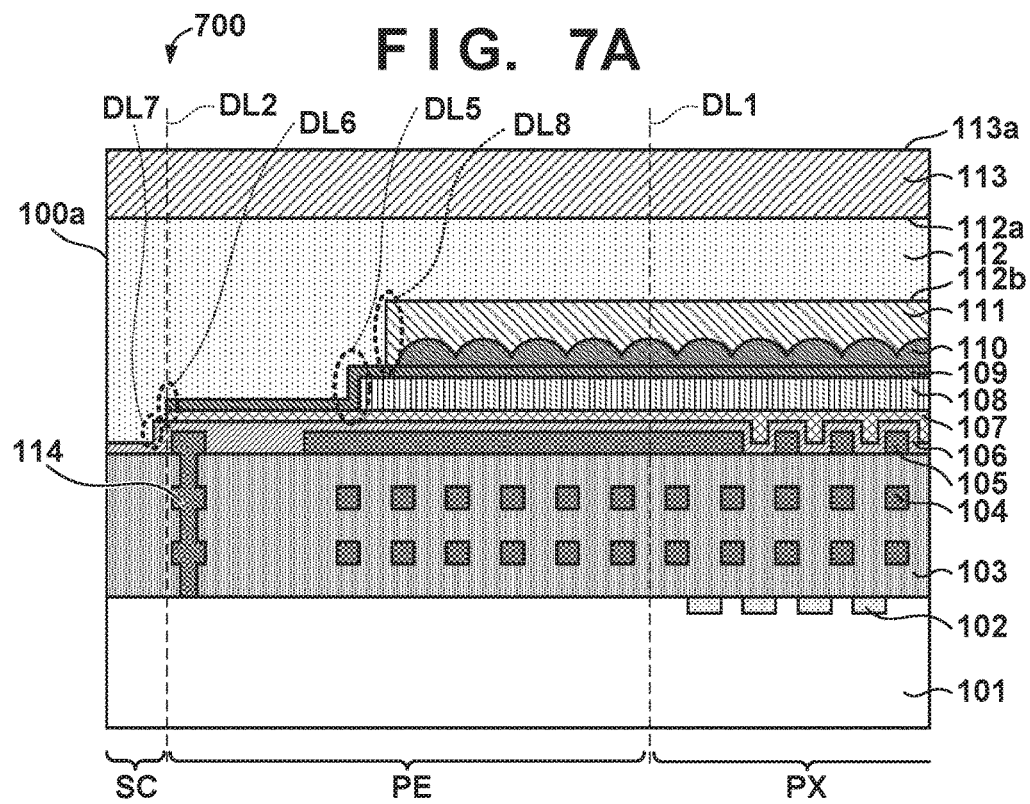
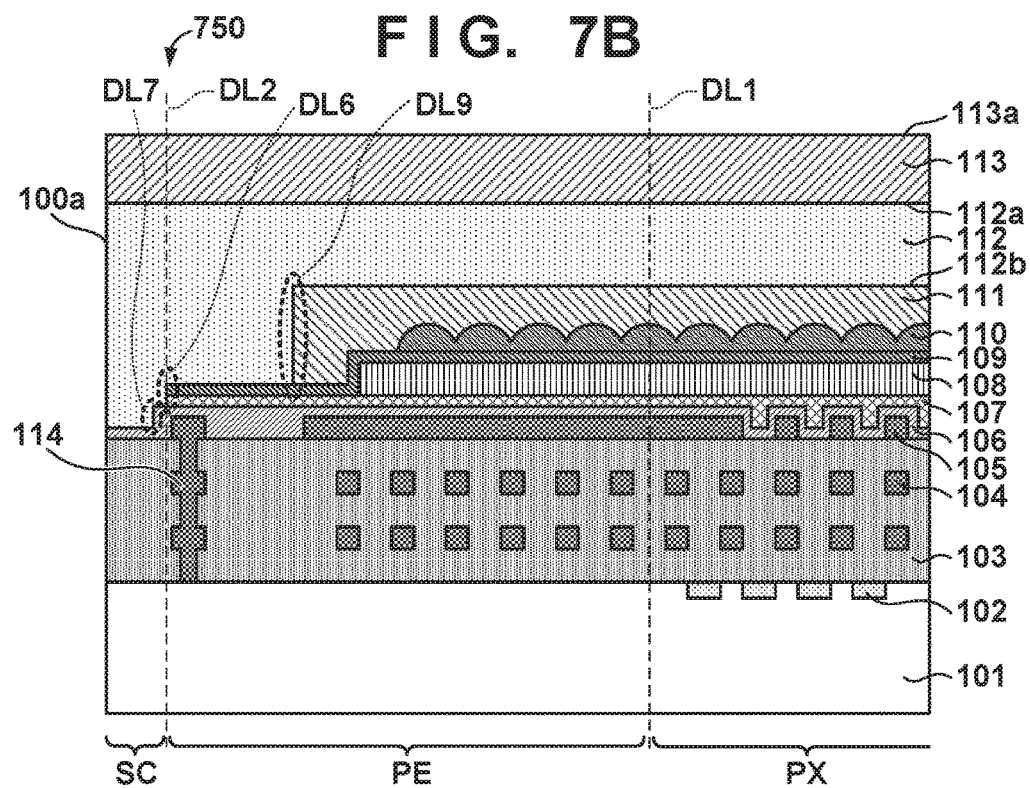

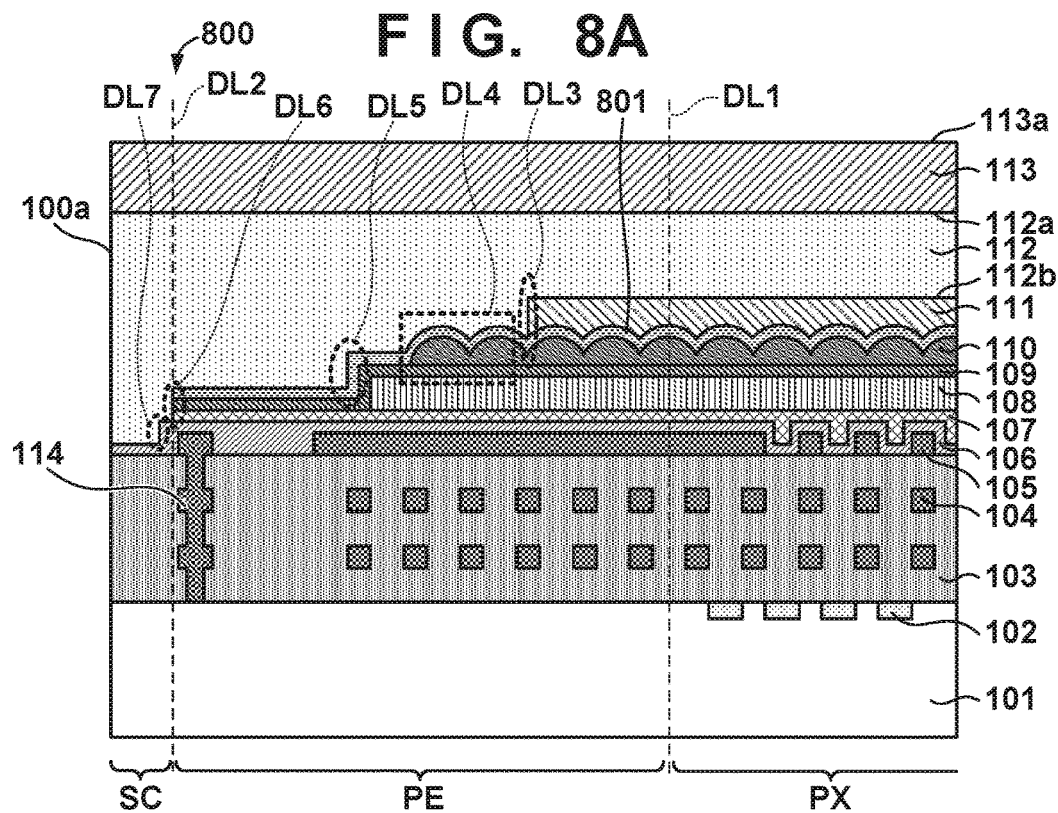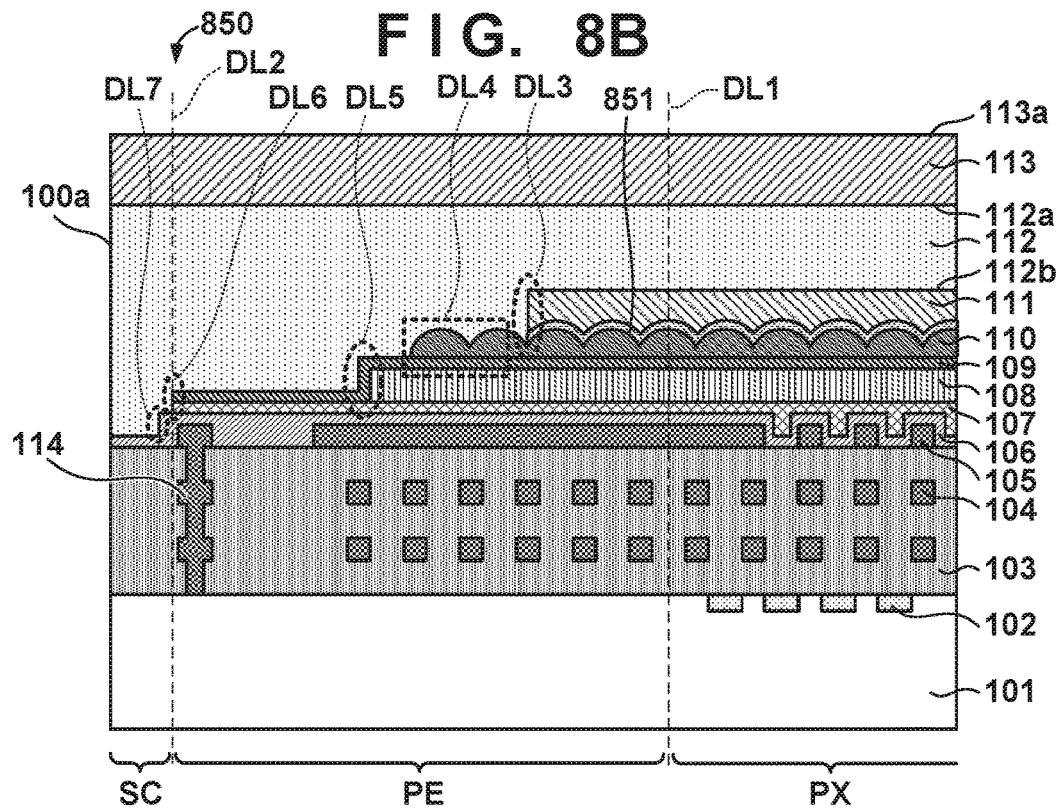

PHOTOELECTRIC CONVERSION APPARATUS AND CAMERA

BACKGROUND OF THE INVENTION

Field of the Invention

The present invention relates to a photoelectric conversion apparatus and a camera.

Description of the Related Art

Photoelectric conversion apparatuses in which a wafer level chip size package (WL-CSP) is used are broadly divided into those having a cavity structure and those having a fill structure. In photoelectric conversion apparatuses having a cavity structure, a photoelectric conversion substrate and a light transmissive plate are mutually bonded by ring shaped bonding members, and there are voids between a microlens array of the photoelectric conversion substrate and the light transmissive plate. Regarding a photoelectric conversion apparatus having a fill structure, the entire top surface of the photoelectric conversion substrate and a light transmissive plate are mutually bonded by a bonding member. Although a photoelectric conversion apparatus having the fill structure is superior in structural strength compared to a photoelectric conversion apparatus having the cavity structure, it is inferior in microlens power because the microlens array is covered by the bonding member whose refractive index is higher than that of air. Accordingly, in Japanese Patent Laid-Open No. 2015-159275, a photoelectric conversion substrate and a light transmissive plate are mutually bonded by a bonding member after a top surface of a microlens array is covered by a low-refractive index member whose refractive index is lower than the bonding member.

SUMMARY OF THE INVENTION

Depending on the material of the low-refractive index member, the structural strength of the low-refractive index member or the bonding strength between the low-refractive index member and another member is low and it becomes easy for the light transmissive plate to disconnect from the photoelectric conversion substrate. An aspect of the present invention provides a technique for improving a bond between a light transmissive plate and a photoelectric conversion substrate.

According to some embodiments, a photoelectric conversion apparatus comprising: a photoelectric conversion substrate having a plurality of photoelectric conversion units and a microlens array arranged above the plurality of photoelectric conversion units; a light transmissive plate; a first member arranged between the photoelectric conversion substrate and the light transmissive plate, and that bonds the photoelectric conversion substrate and the light transmissive plate; and a second member arranged between the first member and the microlens array, wherein the second member has at least one of a refractive index lower than the microlens array or a porosity higher than the microlens array, and a surface on a side of the photoelectric conversion substrate of the first member has a plurality of steps from a portion over the plurality of photoelectric conversion units to a side surface of the photoelectric conversion apparatus, is provided.

Further features of the present invention will become apparent from the following description of exemplary embodiments (with reference to the attached drawings).

BRIEF DESCRIPTION OF THE DRAWINGS

FIGS. 7A and 7B are views for describing another example of a structure of a photoelectric conversion apparatus in some embodiments.

FIGS. 8A and 8B are views for describing another example of a structure of a photoelectric conversion apparatus in some embodiments.

DESCRIPTION OF THE EMBODIMENTS

Figure 1A:
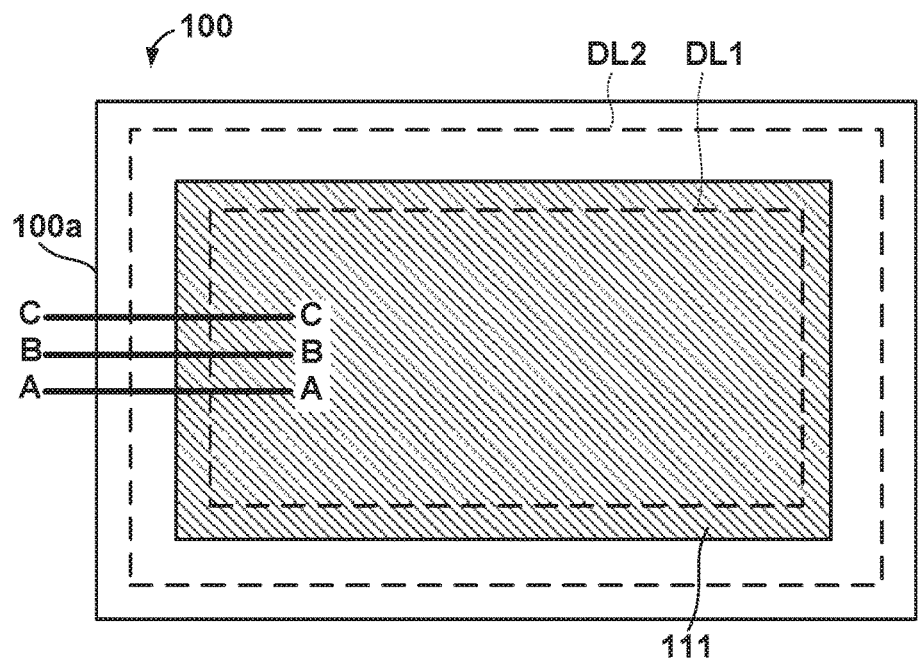
FIGS. 1A and 1B are views for describing an example of a structure of a photoelectric conversion apparatus in some embodiments.

Description is given regarding embodiments of the present invention while referencing attached drawings. The same reference numerals are given to similar elements throughout the various embodiments so duplicate descriptions are omitted. In addition, it is possible to appropriately change and combine each embodiment. In the attached drawings, the scale of each element may be different from that of an actual apparatus in order to simplify comprehension of the described element. Although description is given regarding a front-side illumination photoelectric conversion apparatus below, it is possible to similarly apply the present invention to a back-side illumination photoelectric conversion apparatus. The photoelectric conversion apparatus may also be referred to as a solid-state image capturing apparatus in a case where it is used for forming an image.

Description is given regarding one example of a structure of a photoelectric conversion apparatus 100 according to some embodiments of the present invention with reference to FIG. 1A to FIG. 3B. FIG. 1A is a plan view of the photoelectric conversion apparatus 100, FIG. 1B is a cross-sectional view in the AA line of FIG. 1A, FIG. 2A is a cross-sectional view in the BB line of FIG. 1A, and FIG. 2B is a cross-sectional view in the CC line of FIG. 1A. The photoelectric conversion apparatus 100 is a photoelectric conversion apparatus of a wafer level chip size package. Specifically, the photoelectric conversion apparatus 100 is obtained by, after forming configuration elements of a plurality of photoelectric conversion apparatuses on a semiconductor wafer, dicing the semiconductor wafer to separate the photoelectric conversion apparatuses as described in a method for manufacturing described later.

The photoelectric conversion apparatus 100 has a pixel region PX inside of a dashed line DL1, has a peripheral region PE between the dashed line DL1 and a dashed line DL2, and has a scribe region SC outside of the dashed line DL2 as illustrated in FIG. 1A. The pixel region PX is a region in which a plurality of pixels that convert an incident light to a signal charge are arranged in an array. The peripheral region PE is a region in which a circuit for reading a signal charge accumulated in a pixel or a circuit for driving the pixel is arranged. The scribe region SC is a region which is a target of the dicing in the process for manufacturing of the photoelectric conversion apparatus 100, and a circuit used in an operation of the photoelectric conversion apparatus 100 is not arranged in the scribe region SC. In FIG. 1A, only the dashed lines DL1 and DL2 which illustrate a boundary of each region, and a low-refractive index member 111 are illustrated in order to simplify comprehension of the drawing.

Figure 1B:
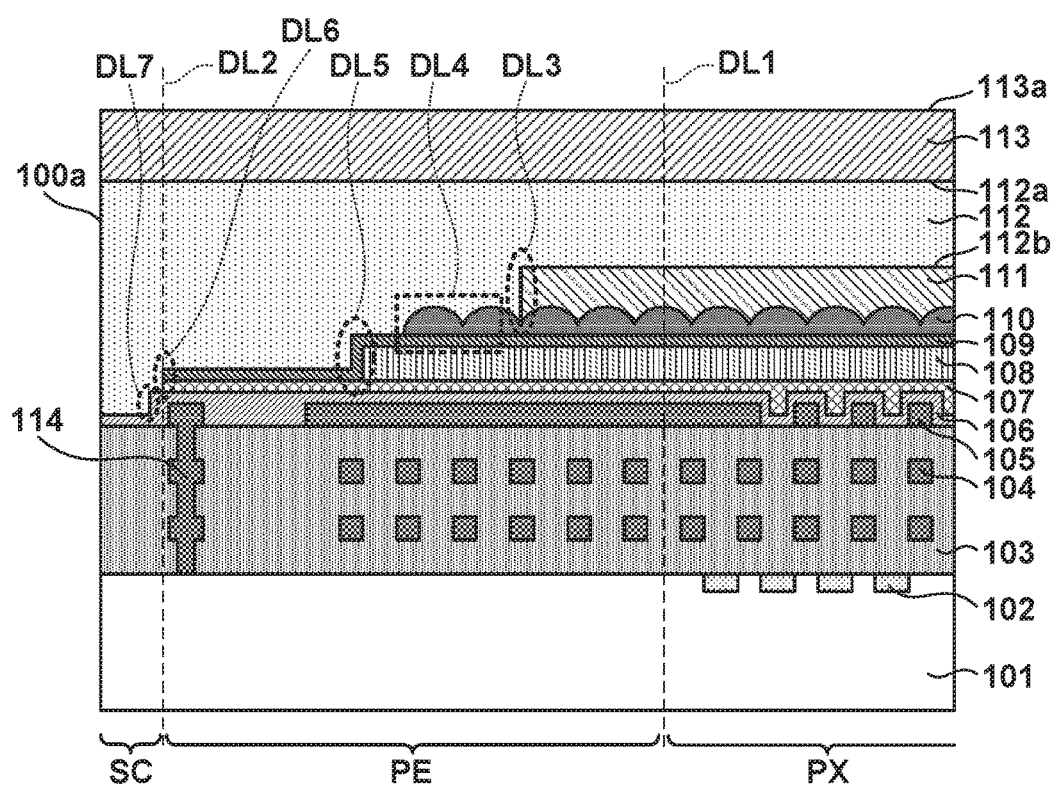

Description is given regarding a cross-sectional structure of the photoelectric conversion apparatus 100 with reference to FIG. 1B. The cross-sectional view of FIG. 1B focuses on a section from a part of the pixel region PX, exceeding a side surface 100a of the photoelectric conversion apparatus 100, and until the outside of the photoelectric conversion apparatus 100. In FIG. 1B, although description is given regarding one side surface 100a (left side surface in FIG. 1A) of the photoelectric conversion apparatus 100, the photoelectric conversion apparatus 100 has the same cross-sectional structure at its other side surfaces.

The photoelectric conversion apparatus 100 has a semiconductor layer 101. The semiconductor layer 101 is a silicon layer for example. In the pixel region PX, a plurality of photoelectric conversion units 102 are arranged in an array in the semiconductor layer 101. Each of the plurality of photoelectric conversion units 102 configure a part of a pixel. Description of another elements of a pixel such as a transistor is omitted because they are well known.

The photoelectric conversion apparatus 100 further has an insulating layer 103 on top of the semiconductor layer 101. The photoelectric conversion apparatus 100 further has a wiring layer 104 formed inside of the insulating layer 103 and a wiring layer 105 formed on top of the insulating layer 103. For this reason, the insulating layer 103 may be referred to as an interlayer insulation layer. The wiring layers 104 and 105 are configured by an electrically conductive member and transfer an electrical signal. Although there are two layers of the wiring layer 104 in the example of FIG. 1B, the number of layers of the wiring layer 104 is not limited to this. The wiring layers 104 and 105 are arranged in the pixel region PX and the peripheral region PE. The photoelectric conversion apparatus 100 further has a ring shaped moisture-proof ring 114 protruding from the top side of the insulating layer 103 formed inside of the insulating layer 103 in the peripheral region PE. The moisture-proof ring 114 entirely surrounds the periphery of the wiring layers 104 and 105. The moisture-proof ring 114 may be formed by the same material as the wiring layer 104.

The photoelectric conversion apparatus 100 further has a passivation film 106 on top of the insulating layer 103 and the wiring layer 105. The passivation film 106 is arranged across the entirety of the photoelectric conversion apparatus 100. Specifically, an edge of the passivation film 106 extends until the side surface 100a of the photoelectric conversion apparatus 100. The top surface of the passivation film 106 has an unevenness in accordance with a pattern of the wiring layer 105 in the example of FIG. 1B. Alternatively, the top surface of the passivation film 106 may be flat.

The photoelectric conversion apparatus 100 further has a planarizing layer 107 on top of the passivation film 106. The planarizing layer 107 is a resin layer formed by a resin for example. The top surface of the planarizing layer 107 is flat. The planarizing layer 107 is arranged across the entirety of the pixel region PX and the peripheral region PE, and is not arranged in the scribe region SC. In the example of FIG. 1B, the edge of the planarizing layer 107 extends until the boundary (dashed line DL2) of the peripheral region PE and the scribe region SC. Alternatively, the edge of the planarizing layer 107 may extend until part way through the peripheral region PE.

The photoelectric conversion apparatus 100 further has a color filter layer 108 on top of the planarizing layer 107. The color filter layer 108 is formed by a resin for example. A plurality of color filters corresponding to the plurality of pixels are formed in the color filter layer 108. The plurality of color filters are arranged in a Bayer arrangement for example. The top surface of the color filter layer 108 has an unevenness because height differs for each color filter. The color filter layer 108 is arranged across the entirety of the pixel region PX and to part way through the peripheral region PE, and is not arranged in the scribe region SC. Specifically, the edge of the color filter layer 108 extends until part way through the peripheral region PE.

The photoelectric conversion apparatus 100 further has a planarizing layer 109 on top of the planarizing layer 107 and the color filter layer 108. The planarizing layer 109 is a resin layer formed by a resin for example. The portion of the top surface of the planarizing layer 109 that is on top of the color filter layer 108 is flat, and the portion of the top surface of the planarizing layer 109 that is outside of the color filter layer 108 is also flat. The portions of the top surface of the planarizing layer 109 on top of the color filter layer 108 and outside of the color filter layer 108 are at different heights from the semiconductor layer 101. The planarizing layer 109 is arranged across the entirety of the pixel region PX and the peripheral region PE, and is not arranged in the scribe region SC. In the example of FIG. 1B, the edge of the planarizing layer 109 extends until the boundary (dashed line DL2) of the peripheral region PE and the scribe region SC. Alternatively, the edge of the planarizing layer 109 may extend until part way through of the peripheral region PE. In the example of FIG. 1B, the edge of the planarizing layer 107 and the edge of the planarizing layer 109 extend until the same position. Configuration may be taken such that the photoelectric conversion apparatus 100 does not have the color filter layer 108 or the planarizing layer 109 in a case where an identification of colors is not necessary in the photoelectric conversion apparatus 100.

The photoelectric conversion apparatus 100 further has a microlens array 110 on top of the planarizing layer 109. The microlens array 110 is formed by a resin for example. The microlens array 110 may be formed by an organic material and may be formed by an inorganic material. The microlens array 110 is a group of a plurality of microlenses arranged in an array. The plurality of microlenses are arranged corresponding to the plurality of photoelectric conversion units 102 and the top surface of each microlens is a convex curve. The microlens array 110 is arranged across the entirety of the pixel region PX and to part way through the peripheral region PE, and is not arranged in the scribe region SC. The microlens array 110 may be formed by the same material as the planarizing layer 109 or may be formed by a different material. The edge of the microlens array 110 is positioned further inside (a side farther from the side surface 100a) than the edge of the color filter layer 108.

The photoelectric conversion apparatus 100 further has the low-refractive index member 111 on top of the microlens array 110. The low-refractive index member 111 is arranged across the entirety of the pixel region PX and to part way through the peripheral region PE, and is not arranged in the scribe region SC. The edge of the low-refractive index member 111 is positioned further inside (a side farther from the side surface 100a) than the edge of the microlens array 110. In this way, the low-refractive index member 111 covers a part of the microlens array 110.

A structure formed from the above described semiconductor layer 101 to the microlens array 110 is referred to as a photoelectric conversion substrate. The photoelectric conversion apparatus 100 further has the low-refractive index member 111, a bonding member 112, and a light transmissive plate 113. The refractive index of the low-refractive index member 111 is lower than the refractive index of the microlens array 110. In a case where the low-refractive index member 111 is formed by a single member, the refractive index of this member is the refractive index of the low-refractive index member 111. In a case where the low-refractive index member 111 has a stacked structure and each layer is formed by a different material, the refractive index of the layer closest to the microlens array 110 may be made to be the refractive index of the low-refractive index member 111. This is because the microlens power of the microlens array 110 is determined according to the refractive index of the member of the portion contacting the microlenses. Similarly, in a case where the microlens array 110 is formed by a single member, the refractive index of that member is the refractive index of the microlens array 110. In a case where the microlens array 110 has a stacked structure and each layer is formed by a different material, the refractive index of the layer closest to the low-refractive index member 111 may be made to be the refractive index of the microlens array 110. Typically, the higher the porosity of the member is, the lower the refractive index becomes. For this reason, the porosity of the low-refractive index member 111 may be higher than the porosity of the microlens array 110.

The light transmissive plate 113 is a plate-shaped member through which light passes and is formed by glass for example. The light transmissive plate 113 may have a strength such that it protects the photoelectric conversion substrate. The top surface 113a of the light transmissive plate 113 is a light-receiving surface that receives light incident on the photoelectric conversion apparatus 100. Light that entered from the top surface 113a is converted into an electrical signal by the photoelectric conversion substrate.

The bonding member 112 is arranged between the photoelectric conversion substrate and the light transmissive plate 113, and mutually bonds the photoelectric conversion substrate and the light transmissive plate 113. The low-refractive index member 111 is positioned between the bonding member 112 and the microlens array 110. The bonding member 112 is formed by curing an adhesive agent as described in the method for manufacturing described later. For this reason, the bonding member 112 is a member configured by a single material. An organic material which becomes transparent after being cured, an acrylic epoxy for example, may be used as the adhesive agent material.

The side surface of the bonding member 112 configures a part of the side surface 100a of the photoelectric conversion apparatus 100. The top surface 112a of the bonding member 112 (that is, the surface on the side of the light transmissive plate 113) contacts and is bonded with the light transmissive plate 113. Accordingly, the top surface 112a of the bonding member 112 can be referred to as a contact surface or a bonding surface. The top surface 112a extends until the side surface 100a of the photoelectric conversion apparatus 100 and the entire surface of the top surface 112a is bonded to the light transmissive plate 113. The top surface 112a is flat because the light transmissive plate 113 is a plate-shaped member.

The bottom surface 112b of the bonding member 112 (that is, the surface of the side of the photoelectric conversion substrate) contacts and is bonded with the photoelectric conversion substrate and the low-refractive index member 111. Accordingly, the bottom surface 112b of the bonding member 112 can be referred to as a contact surface or a bonding surface. The top surface 112a and the bottom surface 112b are at opposite sides to each other. The bottom surface 112b extends until the side surface 100a of the photoelectric conversion apparatus 100 and is bonded to the photoelectric conversion substrate in the proximity of the outer circumference of the bottom surface 112b. Specifically, the bottom surface 112b contacts and is bonded with the top surface and the side surface of the low-refractive index member 111 and the portion of the top surface of the microlens array 110 not covered by the low-refractive index member 111. The bottom surface 112b further contacts and is bonded with the portion of the top surface of the planarizing layer 109 not covered by the microlens array 110, the edge of the planarizing layer 107, and a portion of the passivation film 106 not covered by the planarizing layer 107.

Description regarding the shape of the bottom surface 112b is given as follows. A step is formed on a portion surrounded by a dashed line DL3 by the top surface of the photoelectric conversion substrate and the edge of the low-refractive index member 111. The top surface of the photoelectric conversion substrate has a step formed by a portion of the planarizing layer 109 covering the edge of the color filter layer 108 at a portion surrounded by a dashed line DL5. The top surface of the photoelectric conversion substrate further has a step formed by the edge of the planarizing layer 107 and the edge of the planarizing layer 109 at a portion surrounded by a dashed line DL6. Because the edge of the planarizing layer 107 and the edge of the planarizing layer 109 are at the same position, one step is formed by the edges of these. The top surface of the photoelectric conversion substrate further has a step of the passivation film 106 at a portion surrounded by a dashed line DL7. The top surface of the photoelectric conversion substrate further has an unevenness due to a portion of the top surface of the microlens array at a portion surrounded by a dashed line DL4. This unevenness may also be considered a step. Because the bottom surface 112b contacts and is bonded with these steps of the top surface of the photoelectric conversion substrate, the bottom surface 112b has corresponding steps. In this way, a bond between the bonding member 112 and the photoelectric conversion substrate improves due to an anchor effect because the bottom surface 112b has a plurality of steps from the portion on top of the plurality of photoelectric conversion units 102 to the side surface 100a of the photoelectric conversion apparatus 100. Also, when the planarizing layer 107, the color filter layer 108, and the planarizing layer 109 are considered together to be a single member, this member has a plurality of steps (dashed line DL5 and dashed line DL6), and the bottom surface 112b contacts and is bonded with this plurality of steps. In a case where the planarizing layer 107, the color filter layer 108, and the planarizing layer 109 are higher in structural strength than the low-refractive index member 111, the bond between the bonding member 112 and the photoelectric conversion substrate improves even more due to the bottom surface 112*b* being bonded to the plurality of steps of this member.

Figure 2A:
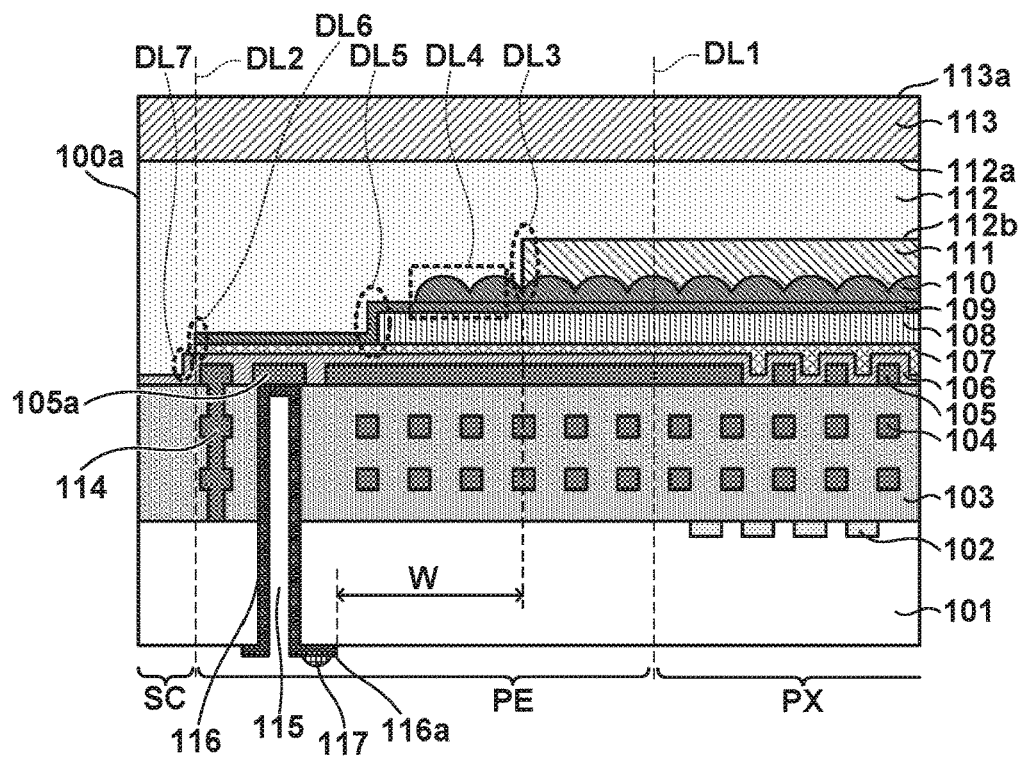
FIGS. 2A and 2B are views for describing an example of a structure of a photoelectric conversion apparatus in some embodiments.

Next, description is given regarding another cross-sectional structure of the photoelectric conversion apparatus 100 with reference to FIG. 2A. FIG. 2A is a cross section at a different position than FIG. 1B, and illustrates a cross section through an electrode 116. The cross-sectional view of FIG. 2A focuses on a section from a part of the pixel region PX, exceeding a side surface 100*a* of the photoelectric conversion apparatus 100, and until the outside of the photoelectric conversion apparatus 100. In FIG. 2A, although description is given regarding one side surface 100*a* (left side surface in FIG. 1A) of the photoelectric conversion apparatus 100, the photoelectric conversion apparatus 100 has the same cross-sectional structure at its other side surfaces.

A through hole 115 is formed in the semiconductor layer 101 and the insulating layer 103 as illustrated in FIG. 2A. One end of the through hole 115 reaches a portion 105*a* of the wiring layer 105. The photoelectric conversion apparatus 100 further has the electrode 116 which passes through the through hole 115. A part of the electrode 116 contacts and is bonded with the portion 105*a* of the wiring layer 105, and another portion 116*a* of the electrode 116 extends parallel to the bottom side of the semiconductor layer 101 (that is, the surface on the side opposite to the light transmissive plate 113). A solder 117 for soldering the photoelectric conversion apparatus 100 to a mounting board is provided on the portion 116*a* of the electrode 116. The portion 116*a* of the electrode 116 and the low-refractive index member 111 are arranged to have a space W between them in the plan view in relation to the top surface 113*a* of the light transmissive plate 113. Due to such an arrangement, it is possible to reduce a force on the low-refractive index member 111 when soldering the photoelectric conversion apparatus 100 to the mounting board. This arrangement is advantageous in a case where the structural strength of the low-refractive index member 111 is low.

Figure 2B:
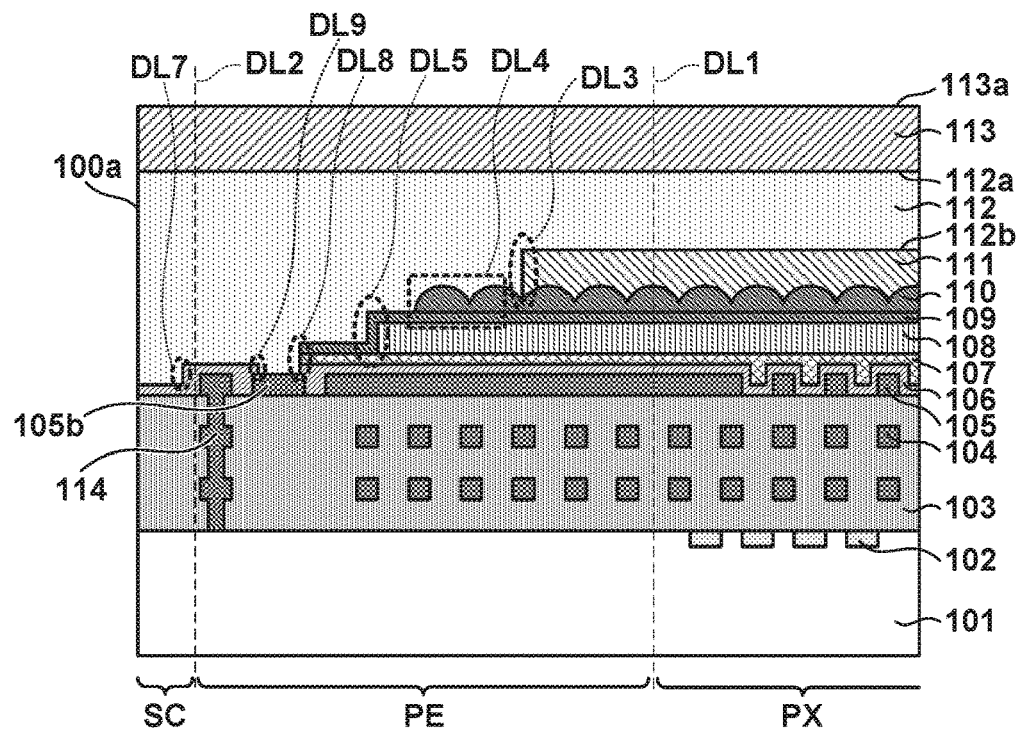

Next, description is given regarding another cross-sectional structure of the photoelectric conversion apparatus 100 with reference to FIG. 2B. FIG. 2B is a cross section at a different position than FIG. 1B, and illustrates a cross section through a pad for inspection. The cross-sectional view of FIG. 2B focuses on a section from a part of the pixel region PX, exceeding a side surface 100*a* of the photoelectric conversion apparatus 100, and until the outside of the photoelectric conversion apparatus 100. In FIG. 2B, although description is given regarding one side surface 100*a* (left side surface in FIG. 1A) of the photoelectric conversion apparatus 100, the photoelectric conversion apparatus 100 may have the same cross-sectional structure at another side surface.

The passivation film 106, the planarizing layer 107, and the planarizing layer 109 are removed from the top of the portion 105*b* of the wiring layer 105. The portion 105*b* of the wiring layer 105 is positioned at the peripheral region PE. The portion 105*b* of the wiring layer 105 functions as a pad for inspecting the photoelectric conversion substrate during manufacturing of the photoelectric conversion apparatus 100. The bottom surface 112*b* of the bonding member 112 also contacts and is bonded with the portion 105*b* of the wiring layer 105. In FIG. 2B, the top surface of the photoelectric conversion substrate additionally has a step due to the edge of the passivation film 106, the planarizing layer 107, and the planarizing layer 109 at a portion surrounded by a dashed line DL8, and a step due to the edge of the passivation film 106 at a portion surrounded by a dashed line DL9. The bottom surface 112*b* of the bonding member 112 also contacts and is bonded with these steps.

Next, an example of a material of the low-refractive index member 111 is described with reference to FIGS. 3A and 3B. In the example illustrated in FIG. 3A, the low-refractive index member 111 is formed by a plurality of chain fillers 301 and a binder 302 (bonding agent) which bonds the plurality of chain fillers 301. Each of the plurality of chain fillers 301 may include a solid silica particle for example. The binder is polysiloxane or an acrylic resin for example. Each chain filler 301 is enveloped in the binder 302. A structure in which the chains of the plurality of chain fillers 301 are sterically bonded is formed by bonding the plurality of chain fillers 301 to each other by the binder 302. For this reason, the low-refractive index member 111 has voids 303 between the plurality of the chain fillers 301.

Figure 3A:
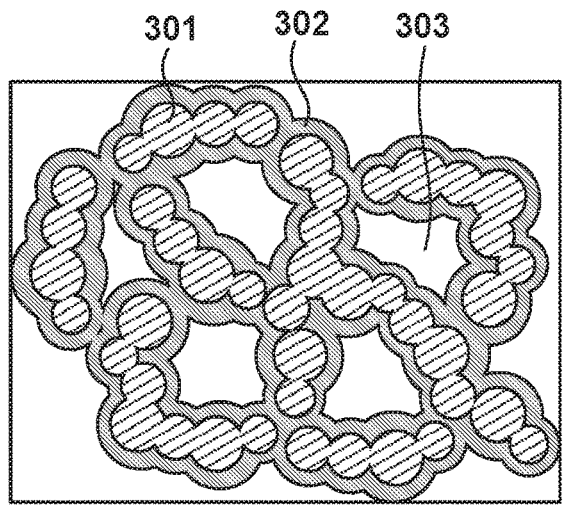
FIGS. 3A and 3B are views for describing an example of materials of a low-refractive index member in some embodiments.
Figure 3B:
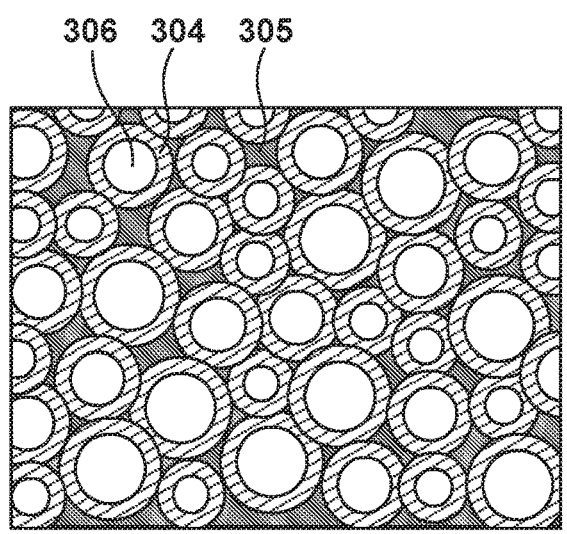

In the example illustrated in FIG. 3B, the low-refractive index member 111 is formed by a plurality of granular fillers 304 and a binder 305 (bonding agent) which bonds the plurality of granular fillers 304. Each of the plurality of granular fillers 304 has a hollow structure including a void 306 inside and may include a hollow silica particle for example. The binder is polysiloxane or an acrylic resin for example.

Because the low-refractive index member 111 is a structure that includes the voids 303 or 306 if either of the materials of the examples of FIGS. 3A and 3B is used, it is possible to increase the porosity more than the microlens array 110. The porosity of the low-refractive index member 111 may be 40-60% for example, and the refractive index of the low-refractive index member 111 may be 1.15-1.30 for example. The porosity of the microlens array 110 may be 0-20% for example, and the refractive index of the microlens array 110 may be 1.50-1.90 for example. In this way, the low-refractive index member 111 has at least one of a refractive index lower than the microlens array 110 and a porosity higher than the microlens array 110. The porosity may be defined as a ratio of a volume that a portion of air occupies out of the whole. It is also possible that the porosity be measured as a ratio of an area that a portion of a void occupies out of the whole in a cross-sectional view. Note, the chain filler 301 may be configured by hollow particles in the example illustrated in FIG. 3A, and there may be a void within the granular filler 304 in the example illustrated in FIG. 3B. In a case where the voids within particles and the voids between particles are mixed in this way, it is possible to calculate a porosity by combining both the voids within the particles and the voids between the particles.

As described above, in the photoelectric conversion apparatus 100, bonding between the bonding member 112 and the photoelectric conversion substrate improves because the bottom surface 112*b* of the bonding member 112 has a plurality of steps from a portion on top of the plurality of photoelectric conversion units 102 to the side surface 100*a* of the photoelectric conversion apparatus 100. Also, it is possible to reduce a proportion of a bonding area with the low-refractive index member 111 whose bonding strength is relatively weak because the bottom surface 112*b* of the bonding member 112 also contacts and bonds with a part of the top surface of the microlens array 110 and a part of the top surface of the planarizing layer 109. Furthermore, in a case of where a part of the photoelectric conversion substrate (the microlens array 110 for example) is formed by an organic material and the bottom surface 112*b* of the bonding member 112 contacts and is bonded with a portion of the organic material, an improvement in adhesion due to a polar group such as an OH group or a COOH group is achieved. Peeling or cracking due to moisture absorption, shock, and temperature change at a time of using the photoelectric conversion apparatus 100 can be suppressed by improving the bond between the bonding member 112 and the photoelectric conversion substrate.

Figure 4A:
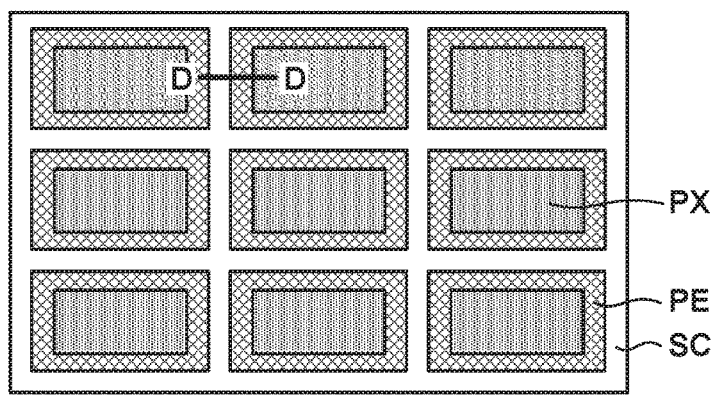
FIGS. 4A-4C are views for describing an example of a method for manufacturing a photoelectric conversion apparatus in some embodiments.
Figure 4B:
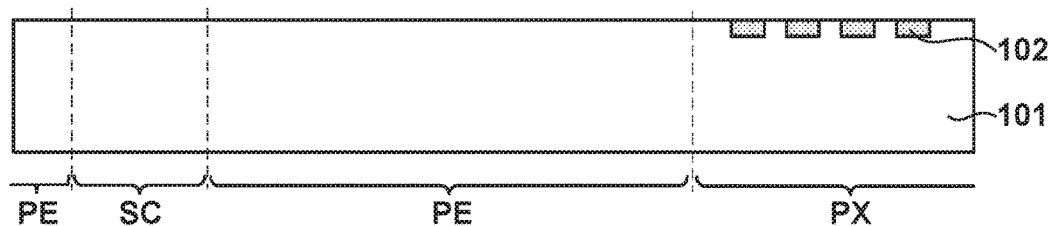

Next, a description is given regarding a method for manufacturing of the photoelectric conversion apparatus 100 with reference to FIG. 4A to FIG. 6B. Firstly, the semiconductor layer 101 as illustrated in FIGS. 4A and 4B is prepared. FIG. 4A illustrates a plan view of the semiconductor layer 101, and FIG. 4B illustrates a cross-sectional view in a DD line. The DD line of FIG. 4A is at a position corresponding to the CC line of FIG. 1A. A plurality of pairs of the pixel region PX and the peripheral region PE in the periphery thereof are arranged in 3 rows and 3 columns spaced apart on the semiconductor layer 101 as illustrated in FIG. 4A. An impurity region (the photoelectric conversion unit 102 for example) for configuring one photoelectric conversion apparatus 100 is formed for each pair of the pixel region PX and the peripheral region PE. A region outside of the peripheral region PE is the scribe region SC. The cross-sectional view of FIG. 4B focuses on a section from a part of one pixel region PX, exceeding the scribe region SC, and to a part of the peripheral region PE for forming another photoelectric conversion apparatus 100.

Figure 4C:
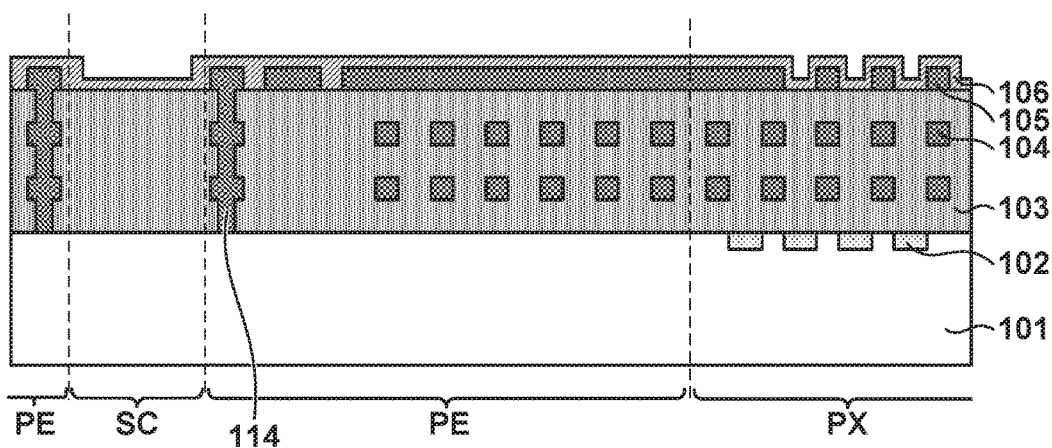
Figure 5A:
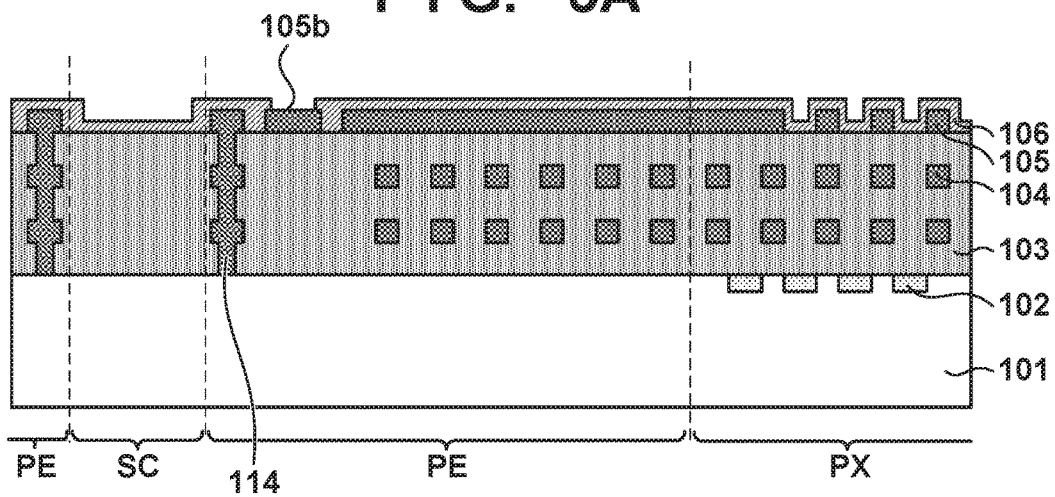
FIGS. 5A and 5B are views for describing an example of a method for manufacturing a photoelectric conversion apparatus in some embodiments.

Next, the insulating layer 103, the wiring layer 104, the wiring layer 105, the moisture-proof ring 114, and the passivation film 106 are formed on top of the semiconductor layer 101 as illustrated in FIG. 4C. A detailed description is omitted because a conventional technique is used in this step. Next, an opening is formed in the passivation film 106 so that the portion 105b of the wiring layer 105 is exposed as illustrated in FIG. 5A. As described above, the portion 105b of the wiring layer 105 is used as a pad for inspection.

Figure 5B:
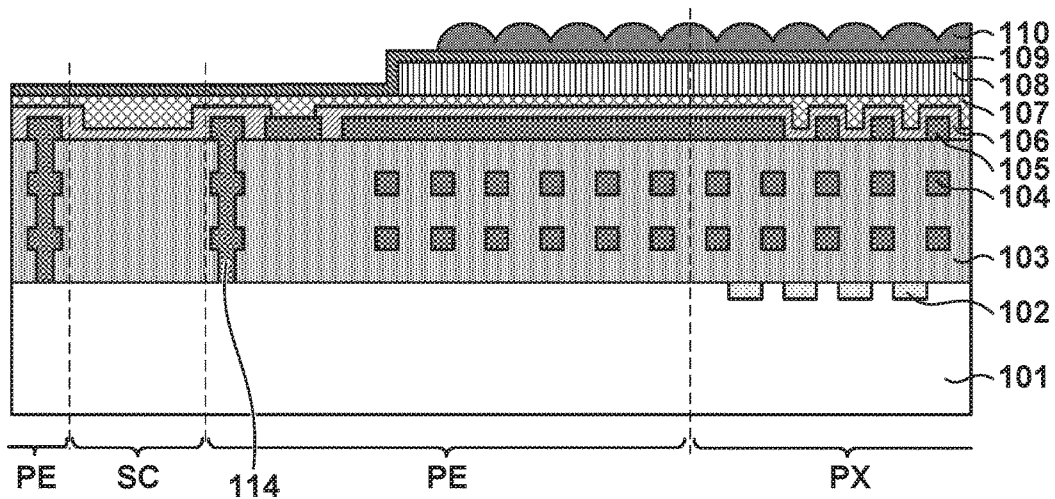

Next, the planarizing layer 107, the color filter layer 108, the planarizing layer 109, and the microlens array 110 are formed in this order on top of the passivation film 106 as illustrated in FIG. 5B. For example, the planarizing layer 107 and the planarizing layer 109 are respectively formed by baking after spin-coating with a resin material. The color filter layer 108 is formed by performing a photolithography step after applying an organic resin. The microlens array 110 is formed by performing a photolithography step or an etchback step after applying an organic material or an inorganic material.

Figure 6A:
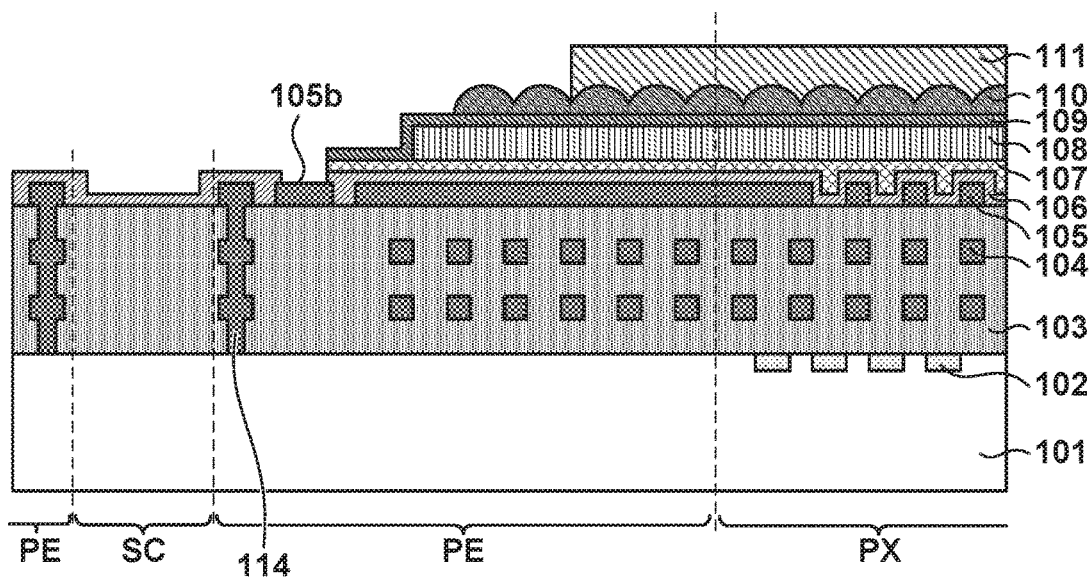
FIGS. 6A and 6B are views for describing an example of a method for manufacturing a photoelectric conversion apparatus in some embodiments.

Next, portions of the planarizing layer 107 and the planarizing layer 109 covering the scribe region SC and the portion 105b of the wiring layer 105 are removed as illustrated in FIG. 6A. In this step, the portions of the planarizing layer 107 and the planarizing layer 109 covering between the scribe region SC and the portion 105b of the wiring layer 105 may also be removed as illustrated in FIG. 6A. After this, the low-refractive index member 111 is formed. For example, the low-refractive index member 111 is formed by a dry etching, a wet etching, a printing method, or the like. The low-refractive index member 111 may be formed by a photolithography step in a case where the low-refractive index member 111 is formed by a photosensitive material. The photoelectric conversion substrate is formed by the foregoing steps.

Figure 6B:
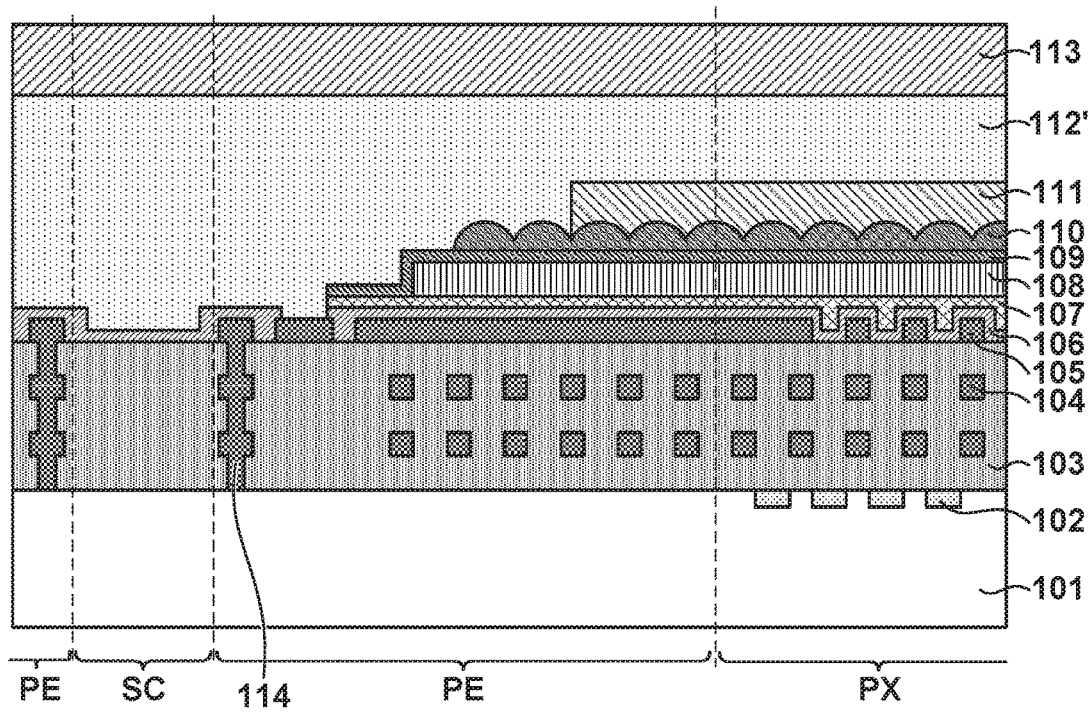

Next, the photoelectric conversion substrate formed by the foregoing steps and the light transmissive plate 113 which is prepared separately, are bonded together by an adhesive agent 112' and the adhesive agent 112' is caused to be cured after this as illustrated in FIG. 6B. The cured adhesive agent 112' is the bonding member 112. After this, the semiconductor layer 101 is thinned by polishing the bottom side of the semiconductor layer 101. Then, the through hole 115 penetrating the semiconductor layer 101 and the insulating layer 103 is formed and the electrode 116 which passes through this through hole 115 is formed. Furthermore, a plurality (nine in this example) of photoelectric conversion apparatuses 100 are obtained by dicing the scribe region SC.

Next, description is given regarding various variations of the photoelectric conversion apparatus 100 with reference to FIG. 7A to FIG. 9B. A configuration illustrated in a variation, may be applied to only some of the side surfaces of the photoelectric conversion apparatus 100 and may be applied to all of the side surface. Also, the applied variation may be the same or may be different for each side surface of the photoelectric conversion apparatus 100. In the description below, description regarding the same configuration as in the photoelectric conversion apparatus 100 is omitted, and description regarding points of difference is given. Each drawing described below corresponds to the cross-sectional view of the photoelectric conversion apparatus 100 illustrated in FIG. 1B. There are also the same points of difference regarding the cross-sectional views illustrated in FIG. 2A and FIG. 2B.

In a photoelectric conversion apparatus 700 illustrated in FIG. 7A, the position of the edge of the low-refractive index member 111 is different to in the photoelectric conversion apparatus 100. The low-refractive index member 111 covers all of the microlens array 110. The edge of the low-refractive index member 111 is positioned between the edge of the microlens array 110 and the edge of the color filter layer 108 in the plan view for the top surface 113a of the light transmissive plate 113. The edge of the low-refractive index member 111 forms a step at a portion surrounded by the dashed line DL8. The bottom surface 112b of the bonding member 112 also contacts and is bonded with this step.

In a photoelectric conversion apparatus 750 illustrated in FIG. 7B, the position of the edge of the low-refractive index member 111 is different to in the photoelectric conversion apparatus 100. The low-refractive index member 111 covers all of the microlens array 110. The edge of the low-refractive index member 111 is positioned between the edge of the planarizing layer 109 and the edge of the color filter layer 108 in the plan view for the top surface 113a of the light transmissive plate 113. The edge of the low-refractive index member 111 forms a step at a portion surrounded by the dashed line DL9. The bottom surface 112b of the bonding member 112 also contacts and is bonded with this step.

In a photoelectric conversion apparatus 800 illustrated in FIG. 8A, there is a difference from the photoelectric conversion apparatus 100 in that there additionally is an intermediate film 801 which covers the entirety of the top surface of the microlens array 110. The intermediate film 801 is arranged between at least a part of the microlens array 110 and the low-refractive index member 111. The refractive index of the intermediate film 801 is lower than the refractive index of the microlens array 110 and higher than the refractive index of the low-refractive index member 111. For example, in a case where the microlens array 110 is formed by silicon nitride (the refractive index is 1.87), the intermediate film 801 may be formed by silicon oxide (the refractive index is 1.46). The intermediate film 801 has a portion which extends from between the microlens array 110 and the low-refractive index member 111 to further to the outside than the edge of the low-refractive index member 111. This extending portion is positioned between the photoelectric conversion substrate and the bonding member 112. The intermediate film 801 extends until the edge of the planarizing layer 109 in one example, and the edge of the extending portion is separated from the side surface of the photoelectric conversion apparatus 800. The top surface of the portion covering the microlens array 110 in the intermediate film 801 is a curved surface shape similar to the top surface of the microlens array 110. For this reason, a combination of the microlens array 110 and a portion of the intermediate film 801 on the top of the microlens array 110 may be considered to be configuring a microlens array. The intermediate film 801 has various effects such as preventing reflection, improving adhesion, preventing contamination, and mitigating stress. The intermediate film 801 is an inorganic material film, for example.

In a photoelectric conversion apparatus 850 illustrated in FIG. 8B, there is a difference from the photoelectric conversion apparatus 100 in that there additionally is an intermediate film 851 which covers a part of the top surface of the microlens array 110. A material of the intermediate film 851 may be the same as the material of the intermediate film 801. The edge of the intermediate film 851 aligns with the edge of the low-refractive index member 111. For this reason, the top surface of the intermediate film 851 does not include a portion that contacts with the bottom surface 112b of the bonding member 112 because it is covered by the low-refractive index member 111.

Figure 9A:
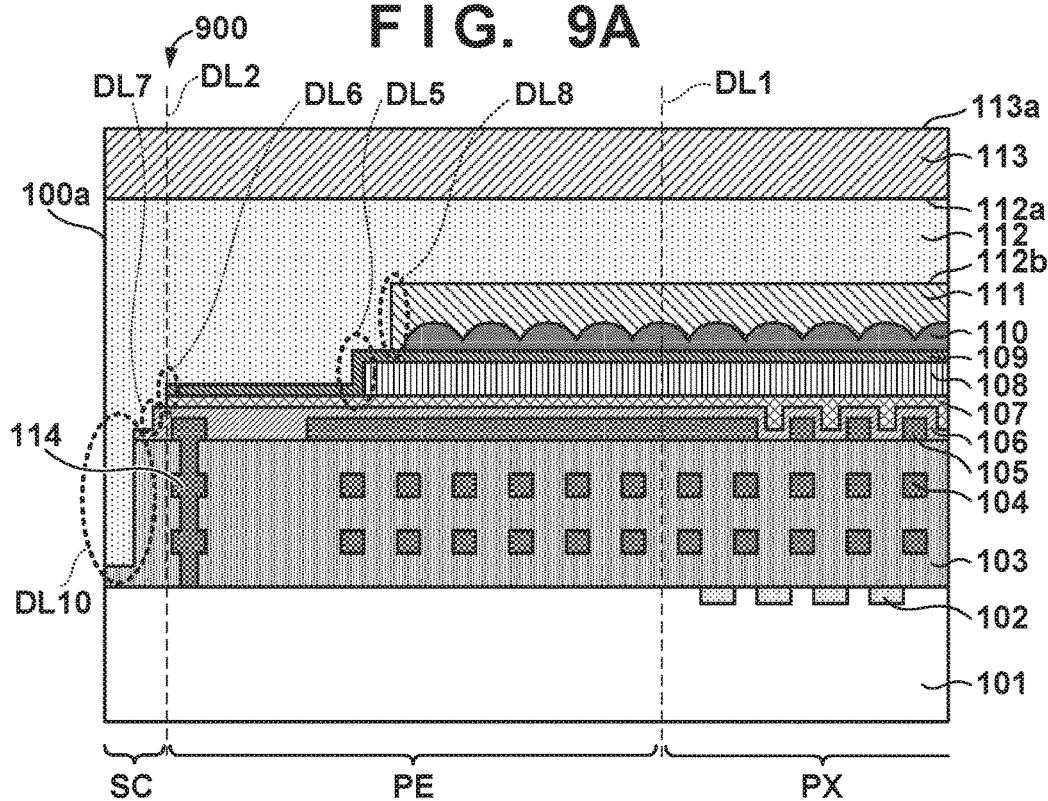
FIGS. 9A and 9B are views for describing another example of a structure of a photoelectric conversion apparatus in some embodiments.

In a photoelectric conversion apparatus 900 illustrated in FIG. 9A, there is a difference from the photoelectric conversion apparatus 100 in that the insulating layer 103 has a step at a portion surrounded by a dashed line DL10. The bottom surface 112b of the bonding member 112 also contacts and is bonded with this step. The bonding member 112 does not contact with the semiconductor layer 101 because a part of the insulating layer 103 remains on a portion of the bottom of this step.

Figure 9B:
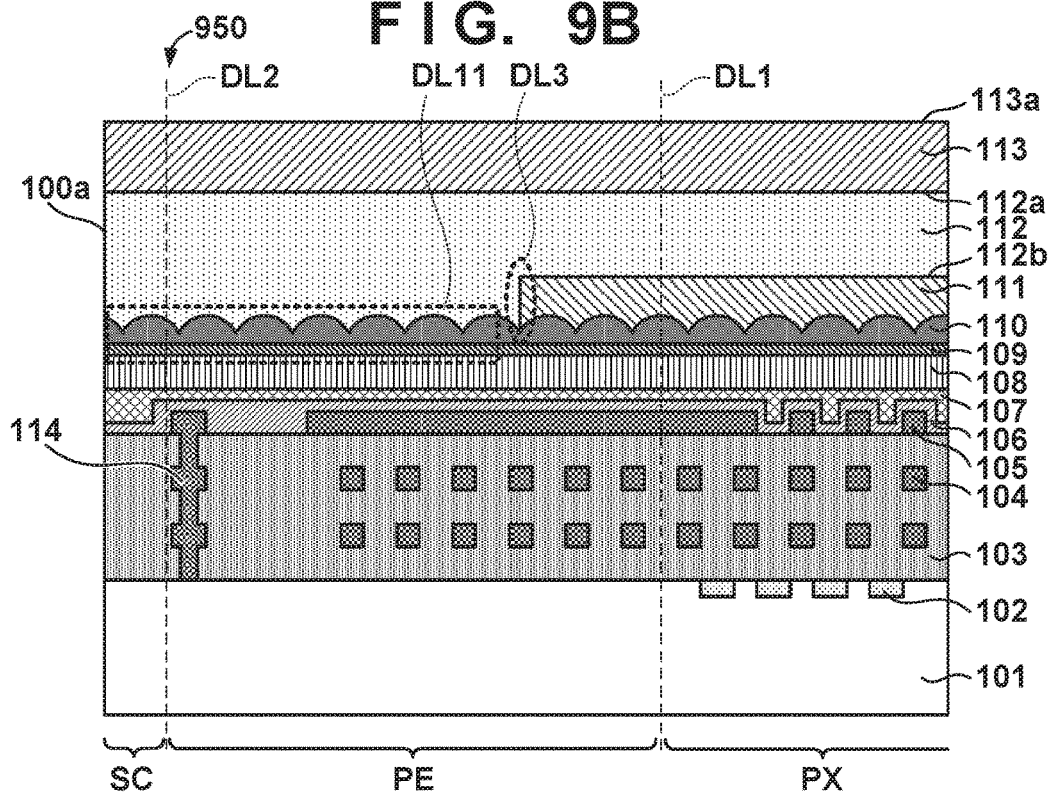

In a photoelectric conversion apparatus 950 illustrated in FIG. 9B, there is a difference from the photoelectric conversion apparatus 100 in that the planarizing layer 107, the color filter layer 108, the planarizing layer 109, and the microlens array 110 each extend until the side surface 100a of the photoelectric conversion apparatus 100. A portion of the microlens array 110 surrounded by a dashed line DL11 is not covered by the low-refractive index member 111. For this reason, the bottom surface 112b of the bonding member 112 contacts and is bonded with this portion of the microlens array 110.

Hereinafter, a description is exemplarily given of a camera in which this photoelectric conversion apparatus is embedded as an application of the photoelectric conversion apparatus according to each of the foregoing embodiments. Not only apparatuses whose main purposes are capturing but also apparatuses having a supplemental capturing function (such as a personal computer, a mobile terminal, and an automobile for example) are also included in the concept of camera. Also, the camera may be a modular part such as a camera head for example. The camera includes the photoelectric conversion apparatus according to the present invention as exemplified in the foregoing embodiments and a signal processor for processing a signal outputted from this photoelectric conversion apparatus. This signal processor may include a processor for processing digital data based on a signal obtained by the photoelectric conversion apparatus for example. An A/D converter for generating this digital data may be arranged in a semiconductor layer of the photoelectric conversion apparatus and may be arranged in a separate semiconductor layer. Also, it is possible to separately use a support substrate arranged on a side opposite to the light transmissive plate 113 with respect to the semiconductor layer 101 in a case where the semiconductor layer 101 is thinned to approximately 1 µm to 500 µm. On this support substrate, an A/D converter, a processor, a memory, or the like may be arranged.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-165072, filed Aug. 25, 2016, which is hereby incorporated by reference herein in its entirety.

What is claimed is:

1. A photoelectric conversion apparatus comprising:
   a photoelectric conversion substrate having a plurality of photoelectric conversion units and a microlens array arranged above the plurality of photoelectric conversion units;
   a light transmissive plate;
   a first member arranged between the photoelectric conversion substrate and the light transmissive plate, and that bonds the photoelectric conversion substrate and the light transmissive plate, the first member being formed of a single material, a portion of the first member being located directly above the microlens array; and
   a second member arranged between the first member and the microlens array, wherein the second member has at least one of a refractive index lower than the microlens array or a porosity higher than the microlens array,
   wherein a surface of the first member on a side of the photoelectric conversion substrate has a plurality of steps from a portion over the plurality of photoelectric conversion units to a side surface of the photoelectric conversion apparatus, and
   wherein over the plurality of photoelectric conversion units, a surface of the second member on a side of the light transmissive plate is flat, wherein the plurality of steps of the surface of the first member includes a first step, a second step, and a third step,
      wherein the third step is closer to the side surface of the photoelectric conversion apparatus than the second step is,
      wherein the second step is closer to the side surface of the photoelectric conversion apparatus than the first step is,
      wherein the first step is closer to the light transmissive plate than the second step is, and
      wherein the second step is closer to the light transmissive plate than the third step is.

2. The photoelectric conversion apparatus according to claim 1, wherein a part of the surface of the first member has an unevenness corresponding to an unevenness configured by the microlens array.

3. The photoelectric conversion apparatus according to claim 1, wherein the second member includes a plurality of fillers bonded by a binder, and
   wherein the second member has voids between the plurality of fillers.

4. The photoelectric conversion apparatus according to claim 1, wherein the second member includes a plurality of fillers bonded by a binder, and
   wherein the plurality of fillers have a hollow structure.

5. The photoelectric conversion apparatus according to claim 1, wherein the first member contacts the second member.

6. The photoelectric conversion apparatus according to claim 1, wherein the photoelectric conversion substrate further comprises an electrically conductive member, and
wherein the first member contacts the electrically conductive member.

7. The photoelectric conversion apparatus according to claim 1, wherein the photoelectric conversion substrate further comprises:
a semiconductor layer in which the plurality of photoelectric conversion units are arranged;
an insulating layer arranged above the semiconductor layer and in which a wiring layer is arranged; and
a third member arranged above the insulating layer,
wherein the microlens array is arranged above the third member,
wherein the third member has a plurality of steps, and
wherein the first member covers the plurality of steps of the third member.

8. The photoelectric conversion apparatus according to claim 7, wherein the third member includes: a first resin layer, a color filter layer arranged above the first resin layer, and a second resin layer configured to cover the color filter layer, and
wherein the plurality of steps of the third member include:
a first step configured by a portion of the second resin layer that covers an edge of the color filter layer, and a second step configured by an edge of the first resin layer and an edge of the second resin layer.

9. The photoelectric conversion apparatus according to claim 7, wherein the insulating layer has a step, and
wherein the first member covers the step of the insulating layer.

10. The photoelectric conversion apparatus according to claim 1, wherein the photoelectric conversion apparatus has an electrode for soldering on a surface of a side opposite to the light transmissive plate, and
wherein the electrode and the second member are arranged to have a space between them in a plan view for a top surface of the light transmissive plate.

11. The photoelectric conversion apparatus according to claim 1, wherein the first member is a member configured by an organic material.

12. The photoelectric conversion apparatus according to claim 1, wherein the photoelectric conversion substrate includes a portion configured by an organic material,
wherein a surface of the photoelectric conversion substrate has a step according to the portion configured by the organic material, and
wherein the first member contacts the step according to the portion configured by the organic material.

13. A camera comprising:
the photoelectric conversion apparatus according to claim 1; and
a signal processor configured to process a signal outputted from the photoelectric conversion apparatus.

14. A photoelectric conversion apparatus comprising:
a photoelectric conversion substrate having a plurality of photoelectric conversion units and a microlens array arranged above the plurality of photoelectric conversion units;
a light transmissive plate;
a first member arranged between the photoelectric conversion substrate and the light transmissive plate, and that bonds the photoelectric conversion substrate and the light transmissive plate; and
a second member arranged between the first member and the microlens array,
wherein the second member has at least one of a refractive index lower than the microlens array or a porosity higher than the microlens array,
wherein the microlens array includes a first region not covered by the second member and a second region covered by the second member,
wherein the first member is bonded to a valley between lenses in the first region of the microlens array and is separated from a peak of a lens in the second region of the microlens array by the second member,
wherein the first region of the microlens array is located on an outer periphery of the second region of the microlens array, and
wherein the plurality of photoelectric conversion units are located under the second region of the microlens array and no photoelectric conversion units are located under the first region of the microlens array.

15. The photoelectric conversion apparatus according to claim 14, wherein the second member includes a plurality of silica particles, bonded by polysiloxane, and
wherein the second member has voids between the plurality of silica particles.

16. The photoelectric conversion apparatus according to claim 14, further comprising a film arranged between at least a part of the microlens array and the second member.

17. The photoelectric conversion apparatus according to claim 16, wherein the film has a portion that extends from between the microlens array and the second member to further to an outside than an edge of the second member, and the extending portion is positioned between the first member and the photoelectric conversion substrate.

18. The photoelectric conversion apparatus according to claim 16, wherein the film has a portion that extends from between the microlens array and the second member to further to an outside than an edge of the second member, and an edge of the extending portion is separated from a side surface of the photoelectric conversion apparatus.

19. A photoelectric conversion apparatus comprising:
a photoelectric conversion substrate having a plurality of photoelectric conversion units and a microlens array arranged above the plurality of photoelectric conversion units;
a light transmissive plate;
a first member arranged between the photoelectric conversion substrate and the light transmissive plate, and that bonds the photoelectric conversion substrate and the light transmissive plate, the first member being formed of a single material, a portion of the first member being located directly above the microlens array; and
a second member arranged between the first member and the microlens array, wherein the second member has at least one of a refractive index lower than the microlens array or a porosity higher than the microlens array,
wherein a surface of the first member on a side of the photoelectric conversion substrate has a plurality of steps from a portion over the plurality of photoelectric conversion units to a side surface of the photoelectric conversion apparatus, and
wherein over a photoelectric conversion unit of the plurality of photoelectric conversion units, a surface of the second member on a side of the microlens array follows a shape of a microlens of the microlens array corresponding to the photoelectric conversion unit, whereas a surface of the second member on a side of the light transmissive plate is independent of the shape of the microlens, wherein the plurality of steps of the surface of the first member includes a first step, a second step, and a third step,
wherein the third step is closer to the side surface of the photoelectric conversion apparatus than the second step is,
wherein the second step is closer to the side surface of the photoelectric conversion apparatus than the first step is,
wherein the first step is closer to the light transmissive plate than the second step is, and
wherein the second step is closer to the light transmissive plate than the third step is.

20. A camera comprising:
the photoelectric conversion apparatus according to claim 19; and
a signal processor configured to process a signal outputted from the photoelectric conversion apparatus.

* * * * *